(12) United States Patent
Baldauf et al.

(10) Patent No.: US 7,999,373 B2
(45) Date of Patent: Aug. 16, 2011

(54) ARRANGEMENT HAVING AT LEAST ONE ELECTRONIC COMPONENT

(75) Inventors: Stefan Baldauf, Rankweil (AT); Rudolf Blank, Sulz (AT)

(73) Assignee: B2 Electronic GmbH, Klaus (AT)

( * ) Notice: Subject to any disclaimer, the term of this patent is extended or adjusted under 35 U.S.C. 154(b) by 409 days.

(21) Appl. No.: 12/155,807

(22) Filed: Jun. 10, 2008

(65) Prior Publication Data
US 2008/0247140 A1    Oct. 9, 2008

Related U.S. Application Data

(63) Continuation of application No. PCT/AT2006/000510, filed on Dec. 11, 2006.

(30) Foreign Application Priority Data

Dec. 13, 2005   (AT) ................................ A 1983/2005

(51) Int. Cl.
*H05K 7/20*       (2006.01)

(52) U.S. Cl. ....................................... 257/712; 257/720

(58) Field of Classification Search ................... 257/702, 257/705, 712, 720, 796; 361/710
See application file for complete search history.

(56) References Cited

U.S. PATENT DOCUMENTS

| | | | |
|---|---|---|---|
| 5,576,578 A | * | 11/1996 | Fuhrer et al. ................. 257/706 |
| 5,818,101 A | | 10/1998 | Schuster |

FOREIGN PATENT DOCUMENTS

| | | |
|---|---|---|
| EP | 0 785 708 | 7/1997 |
| JP | 10-189803 | 7/1998 |
| JP | 11-243166 | 9/1999 |
| JP | 2003-109972 | 4/2003 |
| JP | 2004-087735 | 3/2004 |

OTHER PUBLICATIONS

International Search Report issued Jun. 21, 2007.
Austrain Patent Office Action issued Jan. 19, 2007.

* cited by examiner

*Primary Examiner* — Roy K Potter
(74) *Attorney, Agent, or Firm* — Wenderoth, Lind & Ponack, L.L.P.

(57) ABSTRACT

The invention relates to an arrangement comprising at least one electronic component and a cooling body associated therewith. A support physically interposed between the electronic component and the cooling body and the support has at least one layer with at least one material of an electric strength of at least 10 kV/mm and a thermal conductivity of at least 5 W/mK. At least one recess and/or at least one protruding element is arranged in and/or on the layer of the support, and is configured in such a manner that it extends, along the surface of the layer of the support, through preferably all electrically possible pathways between the electronic component and the cooling body as compared to the condition of the layer of the support without the recess and/or without the protruding element.

27 Claims, 3 Drawing Sheets

ARRANGEMENT HAVING AT LEAST ONE ELECTRONIC COMPONENT

This application is a continuation of International Application No. PCT/AT2006/000510, filed Dec. 11, 2006.

BACKGROUND OF THE INVENTION

The present invention concerns an arrangement comprising at least one electronic component and a cooling body associated therewith, and a support physically interposed between the electronic component and the cooling body and which has at least one layer with at least one material of a dielectric strength of at least 10 kV/mm and a specific thermal conductivity of at least 5 W/mK.

In addition, the invention also concerns a layer, a support and/or a unit consisting of a support and a cooling body, which are suitable for such an arrangement.

The problem which arises with numerous electronic components is that on the one hand heat which is produced in operation of the electronic component has to be dissipated, but on the other hand it is also necessary to ensure the required dielectric strength, that is to say electrical insulation for preventing unwanted electrical discharges or short-circuits. In the case of most materials with high levels of electrical resistance, that is to say high dielectric strength, the levels of specific thermal conductivity are so low that the heat can only be inadequately transported away from the electronic component. It is already known in the state of the art to use supports between the electronic component and an associated cooling body, which simultaneously have a high dielectric strength of at least 10 kV/mm and a relatively high specific thermal conductivity of at least 5 W/mK. That measure admittedly transports the heat well through the support to the cooling body and at the same time ensures an adequate dielectric strength, but the problem which still arises is that creepage currents outside the support can give rise to unwanted electrical discharges or short-circuits. That applies in particular to what is referred to as the high-voltage region with electrical operating voltages in the kV (kilovolt) range.

The object of the invention is to eliminate that problem of the arrangements of the general kind set forth, which are known in the state of the art.

SUMMARY OF THE INVENTION

The object that is achieved in that arranged in and/or at the layer of the support is at least one recess and/or at least one protruding element. The formation in the form of a recess and/or a protruding element has such a configuration that the recess and/or the protruding element extends or extend (lengthen) along the surface of the layer of the support preferably all electrically possible pathways between the electronic component and the cooling body as compared to the condition of the layer of the support without the recess and/or the protruding element.

It is therefore provided that the surfaces of the layer of the support are at least to be increased in size by at least one recess and/or at least one protruding element in such a way that the creep paths are extended in such a fashion that voltage discharges or short-circuits can no longer occur outside the support or the layer along the surfaces. In that respect, it is beneficial if all electrically possible pathways are increased in length. That is preferably achieved in that the recess and/or the protruding element is of an encircling configuration with respect to the layer of the support and/or the electronic component and/or the cooling body.

In principle, whether the creep path extension is achieved by microscopic recesses and/or protruding elements such as roughening or the like, or by rather macroscopic recesses or protruding elements, is not so very crucial. In that respect, however, in terms of manufacturing technology it is particularly simple if the recess is of a groove-shaped or trench-shaped configuration and/or the protruding element is of a wall-shaped configuration. Ultimately however, irrespective of the kind of implementation, the primary consideration is a suitably long extension (lengthening) of the creep paths. In general, it is beneficial in that respect if the recess and/or the protruding element is or are of such a configuration that the recess and/or the protruding element extends (lengthens) the electrically possible pathways between the electronic component and the cooling body by at least 30% and preferably at least 100%.

Once again, in terms of manufacturing technology it is easy if the entire layer, preferably the entire support, and/or the protruding element which is possibly present is or are made from one and the same material. In that respect, the entire layer or the entire support and the protruding element or elements which is/are possibly provided can have a one-piece configuration. It is however also possible for the entire layer or the support and the protruding elements which are possibly provided to be assembled from interconnected individual portions, preferably by gluing.

Particularly desirable materials for the layer or the support and the protruding element or elements which is or are possibly provided, besides the dielectric strength of at least 10 kV/mm (kilovolts per millimeter), have a specific thermal conductivity of at least 10 W/mK (watts per meter Kelvin). Particularly preferred materials are ceramics such as aluminium oxide (AlO) with a dielectric strength of about 10 kV/mm and a specific thermal conductivity of about 26 W/mK or aluminium nitride (AlN) with dielectric strengths of about 25 kV/mm and specific thermal conductivities of about 150 W/mK.

Particularly preferably the arrangements according to the invention are used when the electronic components are high-voltage components intended for operating voltages of at least 5 kV or between 5 kV and 400 kV. The power losses of such components, which are to be dissipated in the form of heat, are generally at least 10 W (watts) or between 10 W and 10 kW (kilowatts).

In order to prevent short-circuits or discharges not just along the creep paths at the surfaces of the layer of the support but also along other possible paths outside the layer or the support, it can additionally be provided that the electronic component and/or the layer, preferably the support, with the recess or recesses and/or the protruding element or elements, is or are embedded in an electrically insulating medium, preferably in an insulating oil or an insulating gas or a casting resin, preferably completely.

BRIEF DESCRIPTION OF THE DRAWINGS

Further features and details of the present invention will be apparent from the specific description hereinafter. In the drawings.

DETAILED DESCRIPTION OF THE INVENTION

Figure 1:
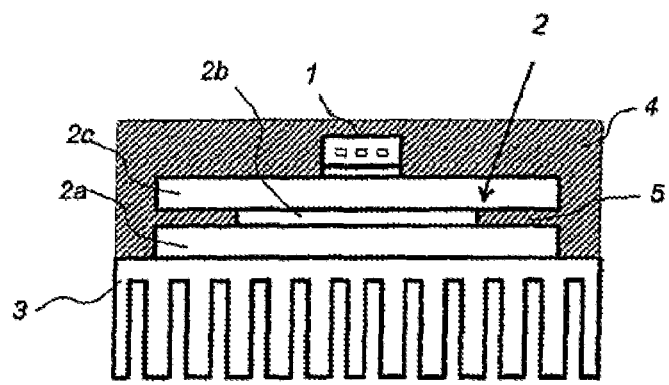
FIGS. 1 and 2 are a sectional view and a perspective view, respectively, of a first embodiment according to the invention with a groove-shaped encircling recess.

The specific embodiments of the invention show combined cooling and insulating systems, in particular for high-voltage applications, in which for example high-voltage amplifiers, controllable high-voltage and high-power resistors, transistors, triacs, diodes or similar applications serve as electronic components 1. On the one hand, the components have to be well cooled and, on the other hand, the components have to be insulated in relation to very high voltages. The drawings show possible configurations in which the supports are made up of at least one layer 2 consisting of aluminium nitride or aluminium oxide. It is also possible to use other materials with correspondingly good specific thermal conductivity and high dielectric strength. In the various illustrated embodiments the support or the layer 2 forming it is of a substantially parallelepipedic configuration in the form of a plate, in terms of the basic structure, that is to say without the illustrated recesses 5. The support or the layer 2 forming it beneficially involves a minimum edge length 6 of 100 mm and/or a minimum thickness 7 of 2 mm, for the high-voltage range. In the illustrated embodiments, a formation such as groove-shaped recesses 5, encircling all around, are provided for extending (lengthening) the creep paths at the surface of the layer 2 or the support respectively. The depth and the width of the recess or recesses 5 or the groove or grooves are dependent on the required dielectric strength and the correspondingly envisaged extension (lengthening) of the creep path. The electronic component 1 to be cooled can for example be glued or clamped on the support or the layer 2. The same applies for the cooling body 3 on the opposite side. In all specific embodiments, the cooling body 3 has cooling ribs. The cooling body can comprise the same material as the layer 2 but also aluminium or other materials which are good at dissipating heat.

All illustrated arrangements are surrounded or enclosed by casting with an insulating medium 4 such as for example insulating oil or insulating gas or casting resin. In that case, the recesses 5 are filled with the insulating material 4. Temperature transfer from the electronic component 1 to the cooling body is effected by way of the support or the layer 2. The support or the layer 2 also provides for the corresponding dielectric strength on the direct path between the electronic component 1 and the cooling body 3. The path extensions (formation) according to the invention formed by the recess or recesses 5 or the protruding element or elements which are not explicitly shown here but which are also possible serve to prevent creepage currents. The insulating material 4 also prevents electrical discharges capable of occurring between the electronic component 1 and the cooling body 3 through the medium surrounding the arrangement, such as air. Preferably, the creep path is at least doubled or tripled by the measures according to the invention. A particularly light and compact structural configuration is possible in particular when using recesses 5.

For arranging the conductor tracks for electrical contacting of the electronic components, the conductor tracks can be arranged on or in the support, for example by means of vaporization. Beneficially, however, it is provided that the electrical contacting means and/or the electrical feed or discharge lines for the electronic component are arranged outside the layer 2 and/or the support. In that case, the layer 2 or the support is therefore not a support for conductor tracks or the like. The electrical connections can be made in another fashion—not shown here—for example by cables leading directly to the electronic component 1 or circuit boards or conductor tracks (also not shown here) arranged above the component 1, that is to say opposite the support. The embodiment of FIGS. 1 and 2 has a groove-shaped recess 5 extending in a completely-encircling relationship in the layer 2. In that way, all electrically possible pathways between the electronic component 1 and the cooling body 3 along the creep paths are extended. FIG. 2 shows a perspective view of the arrangement illustrated in section in FIG. 1.

Figure 2:
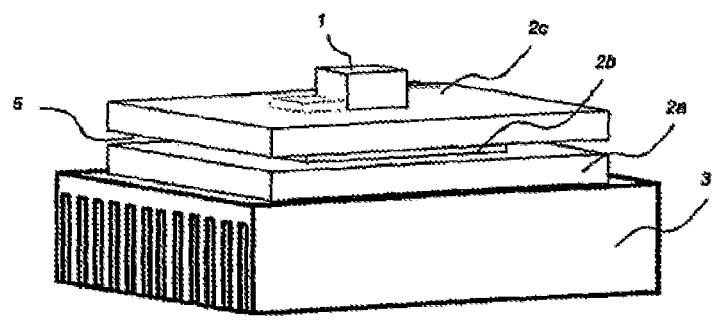
Figure 3:
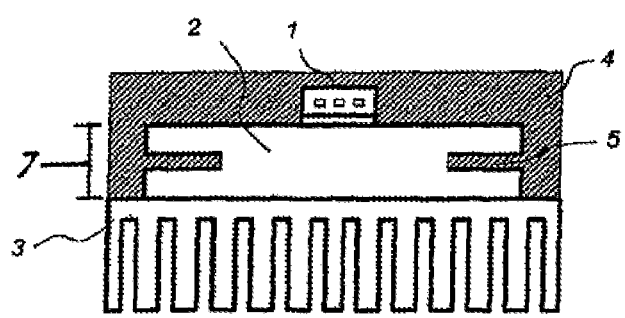
FIG. 3 shows a further embodiment according to the invention in which the support is of a one-piece construction.
Figure 4:
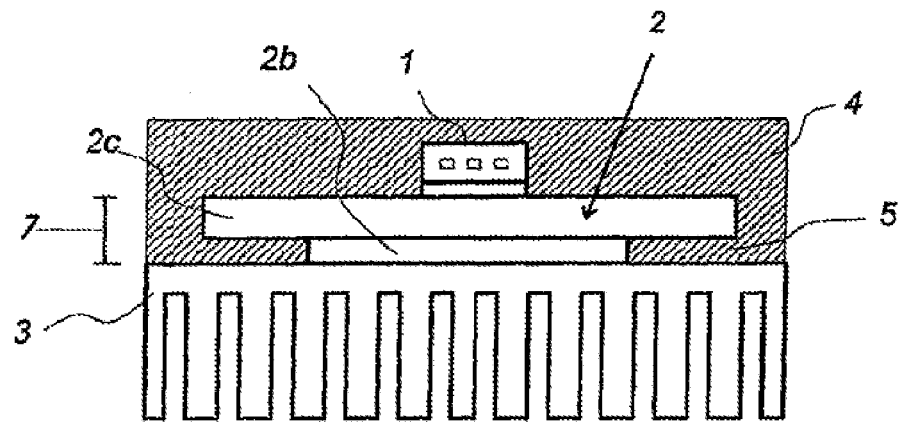
FIGS. 4 and 5 are how sectional views of further variants of embodiments according to the invention with groove-shaped recesses.
Figure 5:
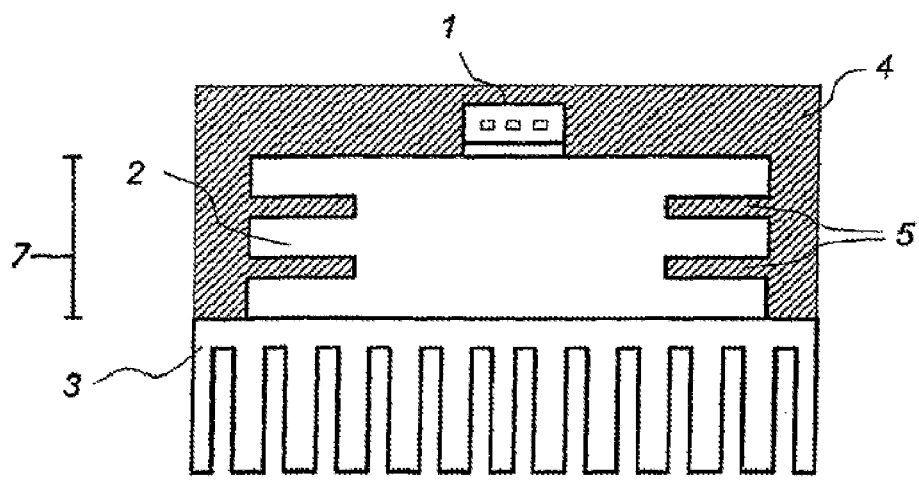

While the embodiment of FIG. 1 provides that the layer 2 (or support) is made up of individual portions 2a, 2b, 2c which are joined together, preferably by gluing, FIG. 3 shows a view in section of an otherwise identical embodiment in which the layer 2 has a one-piece construction. Here, the groove-shaped recess 5 has been cut into the originally parallelepipedic plate forming the layer 2. The same applies for the embodiment of FIG. 5. The embodiment of FIG. 5 shows that basically a sequence of a plurality of grooves is also possible for achieving the desired creep path extension. It will be appreciated that a sequence of a plurality of protruding elements can also be equally used, alone or in combination with recesses.

Figure 6:
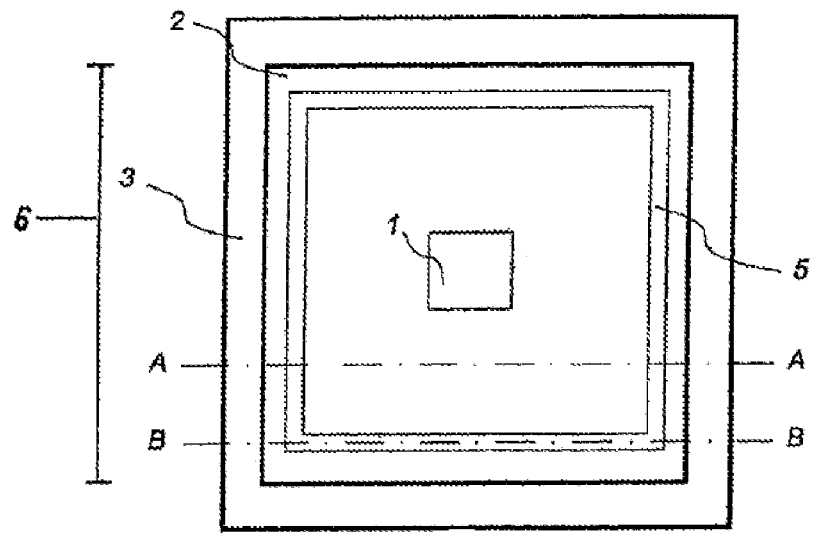
FIGS. 6 to 8 show an embodiment according to the invention with a trench-shaped recess.
Figure 7:
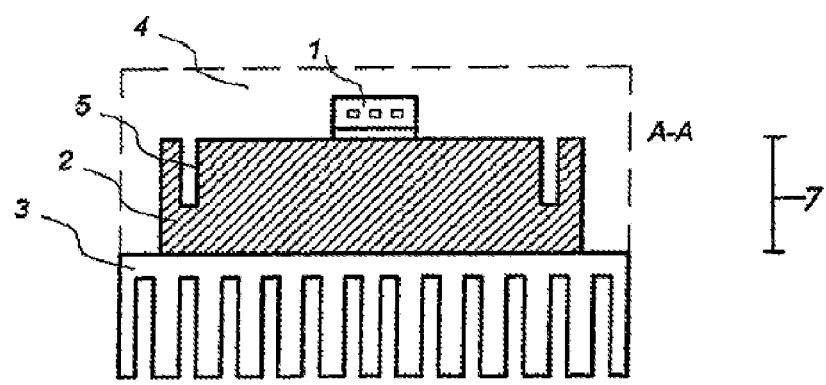
Figure 8:
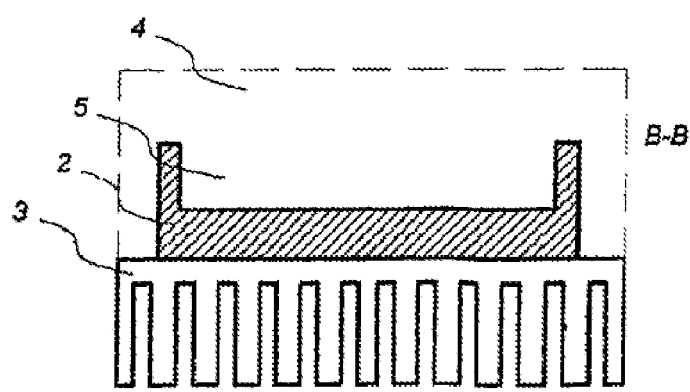

FIGS. 6 to 8 show an embodiment in which the recess 5 is cut in a trench-like shape into the layer 2 or the support not laterally but on the side (e.g., top side) on which the electronic component 1 is also disposed. FIG. 6 shows a plan view in which the cover of insulating medium 4 is omitted. FIG. 7 shows a section along the straight line AA. FIG. 8 shows a section along the straight line BB.

The dielectric strengths according to the invention can be determined on the material in accordance with IEC 60672-2. The specific thermal conductivities could be determined in accordance with EN 821-3. Even if the support consists exclusively of the layer 2 in the illustrated embodiments according to the invention, the support, besides that support layer 2, can certainly also comprise further layers. The layer 2 can also be made up of different materials and can also be of a layered configuration. It will be appreciated that a plurality of and, for example, at least three electronic components can also be mounted on the support. If the support or layer 2 is or are composed of a plurality of individual components, the connection thereof is to be particularly beneficially effected by means of an adhesive affording suitable properties.

The invention claimed is:

1. An arrangement comprising:
   an electronic component;
   a cooling body associated with said electronic component; and
   a support interposed between said electronic component and said cooling body, said support having a layer formed of a material having a dielectric strength of at least 10 kV/mm and a specific thermal conductivity of at least 5 W/mK, said layer of said support having:
   a top surface supporting said electronic component;
   a circumferential surface adjacent to said top surface and oriented transversely with respect to said top surface; and
   a formation at said circumferential surface, said formation being configured to extend along said circumferential surface of said layer so as to lengthen electrically possible pathways between said electronic component and said cooling body as compared with a condition of the layer without the formation, said formation comprising at least one of a recess in said circumferential surface and a protruding element on said circumferential surface.

2. The arrangement of claim 1, wherein said formation is configured to extend along said circumferential surface of said layer so as to lengthen all electrically possible pathways between said electronic component and said cooling body.

3. The arrangement of claim 1, wherein said formation is configured to extend along an entirety of said circumferential surface so as to encircle said support.

4. The arrangement of claim 1, wherein said formation comprises said recess having a groove-shaped or a trench-shaped configuration.

5. The arrangement of claim 1, wherein said formation comprises said protruding element having a wall-shaped configuration.

6. The arrangement of claim 1, wherein said formation is configured so as to lengthen the electrically possible pathways between said electronic component and said cooling body by at least 30%.

7. The arrangement of claim 1, wherein said formation is configured so as to lengthen the electrically possible pathways between said electronic component and said cooling body by at least 100%.

8. The arrangement of claim 1, wherein said formation comprises said protruding element, at least two selected from a group consisting of said support, said layer of said support, and said protruding element being made from the same material.

9. The arrangement of claim 1, wherein said formation comprises said protruding element, at least two selected from a group consisting of said support, said layer of said support, and said protruding element having a one-piece construction.

10. The arrangement of claim 1, wherein said formation comprises said protruding element, at least one selected from a group consisting of said support, said layer of said support, and said protruding element being constructed from interconnected individual portions.

11. The arrangement of claim 1, wherein a material of said layer of said support comprises one of an aluminium nitride or an aluminium oxide.

12. The arrangement of claim 1, wherein said electronic component comprises a high-voltage component for operating voltages of between 5 kV and 400 kV.

13. The arrangement of claim 1, wherein said electronic component is configured such that power losses of said electronic component are between 10 W and 10 kW and are to be dissipated as heat.

14. The arrangement of claim 1, wherein said electronic component and said support having said layer and said formation are embedded in an electrically insulating medium.

15. The arrangement of claim 14, wherein said insulating medium is one of an insulating oil, an insulating gas, or a casting resin.

16. The arrangement of claim 1, wherein one of said electronic component or said support having said layer and said formation is embedded in an electrically insulating medium.

17. The arrangement of claim 16, wherein said insulating medium is one of an insulating oil, an insulating gas, or a casting resin.

18. The arrangement of claim 1, wherein said support has a substantially parallelepipedic configuration.

19. The arrangement of claim 1, wherein said cooling body has cooling ribs.

20. The arrangement of claim 1, wherein said cooling body comprises aluminium or the same material as said layer of said support.

21. The arrangement of claim 1, further comprising electrical contacts for electrically connecting said electronic component, said electrical contacts being arranged outside said support, said electrical contacts comprising at least one of a contacting member, an electrical feed line, and a discharge line.

22. The arrangement of claim 1, wherein said layer of said support has at least one of a minimum edge length of 100 mm and a minimum thickness of 2 mm.

23. The arrangement of claim 1, wherein said electronic component comprises one of a plurality of electronic components arranged on said top surface of said layer of said support.

24. The arrangement of claim 1, wherein said electronic component comprises one of at least three electronic components arranged on said top surface of said layer of said support.

25. A layer suitable for an arrangement of claim 1.

26. A support suitable for an arrangement of claim 1.

27. An arrangement comprising:
a cooling body to be associated with an electronic component; and
a support to be interposed between the electronic component and said cooling body, said support having a layer formed of a material having a dielectric strength of at least 10 kV/mm and a specific thermal conductivity of at least 5 W/mK, said layer of said support having:
a top surface for supporting the electronic component;
a circumferential surface adjacent to said top surface and oriented transversely with respect to said top surface; and
a formation at said circumferential surface, said formation being configured to extend along said circumferential surface of said layer so as to lengthen electrically possible pathways between the electronic component and said cooling body as compared with a condition of the layer without the formation, said formation comprising at least one of a recess in said circumferential surface and a protruding element on said circumferential surface.

* * * * *